(12) United States Patent  
Uejima (10) Patent No.: US 10,111,331 B2  
(45) Date of Patent: Oct. 23, 2018

(54) COMPONENT MOUNTING SUBSTRATE (71) Applicant: Murata Manufacturing Co., Ltd., Kyoto (JP)

(72) Inventor: Takanori Uejima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/829,881

(22) Filed: Dec. 2, 2017

(65) Prior Publication Data

US 2018/0092208 A1    Mar. 29, 2018

Related U.S. Application Data

(63) Continuation of application No. PCT/JP2016/066105, filed on Jun. 1, 2016.

(30) Foreign Application Priority Data

Jun. 3, 2015  (JP) ................................. 2015-112830

(51) Int. Cl.
*H05K 7/00*    (2006.01)
*H05K 1/11*    (2006.01)
(Continued)

(52) U.S. Cl.
CPC ............. *H05K 1/11* (2013.01); *H05K 1/0204* (2013.01); *H05K 1/0243* (2013.01); *H05K 1/0298* (2013.01); *H05K 1/181* (2013.01)

(58) Field of Classification Search
CPC ...... H05K 1/11; H05K 1/0204; H05K 1/0243; H05K 1/0298; H05K 1/181
(Continued)

(56) References Cited

U.S. PATENT DOCUMENTS

| 6,121,679 | A | 9/2000 | Luvara |
| 8,970,035 | B2 | 3/2015 | Lin |
| 2014/0151874 | A1 | 6/2014 | Obu |

FOREIGN PATENT DOCUMENTS

| JP | S58-2090 | 1/1983 |
| JP | H05-327169 | 12/1993 |

(Continued)

OTHER PUBLICATIONS

Written Opinion for PCT/JP2016/066105 dated Jun. 28, 2016.
International Search Report for PCT/JP2016/066105 dated Jun. 28, 2016.

*Primary Examiner* — Tremesha S Willis
(74) *Attorney, Agent, or Firm* — Pearne & Gordon LLP (57) ABSTRACT

An interlayer connection conductor penetrates through first layers of a multilayer body and projects from an upper surface. In a component mounting substrate, the projection length of the interlayer connection conductor from the upper surface in the lamination direction is adjusted such that a difference between a connection position of the interlayer connection conductor and a conductive bonding portion and a connection position of a connection electrode and a conductive bonding portion in the lamination direction is a difference. A difference between the length of the conductive bonding portion and the length of the conductive bonding portion in the lamination direction is canceled by the difference. As a result, the upper surface and a lower surface are parallel with each other to prevent a high-frequency component from tilting with respect to a mounting substrate, thereby preventing electric connection failure and lowering of bonding strength due to the tilt.

15 Claims, 7 Drawing Sheets

(51) Int. Cl.
*H05K 1/02* (2006.01)
*H05K 1/18* (2006.01)

(58) Field of Classification Search
USPC ............... 361/679.01, 679.02, 728, 748, 760
See application file for complete search history.

(56) References Cited

FOREIGN PATENT DOCUMENTS

| | | |
|---|---|---|
| JP | 2001-223321 | 8/2001 |
| JP | 2012-209796 A | 10/2012 |
| JP | 2014-132635 A | 7/2014 |

FIG. 1

LAMINATION
DIRECTION

COMPONENT MOUNTING SUBSTRATE

This application is a continuation of International Application No. PCT/JP2016/066105 filed on Jun. 1, 2016 which claims priority from Japanese Patent Application No. 2015-112830 filed on Jun. 3, 2015. The contents of these applications are incorporated herein by reference in their entireties.

BACKGROUND OF THE DISCLOSURE

Field of the Disclosure

The present disclosure relates to a component mounting substrate including a component having a plurality of columnar electrodes and a mounting substrate on which the component is mounted on a main surface.

Description of the Related Art

An existing flip chip component including a plurality of columnar electrodes (for example, pillar electrodes made of copper) on a bottom surface has been known (see Patent Document 1). The respective columnar electrodes on the bottom surface of the flip chip component are electrically and physically connected to respective connection electrodes on a main surface of a mounting substrate with conductive bonding portions interposed therebetween.

A flip chip component disclosed in Patent Document 1 includes a plurality of columnar electrodes having different cross-sectional areas in a direction that is parallel with the bottom surface thereof.

Patent Document 1: Japanese Unexamined Patent Application Publication No. 2001-223321

BRIEF SUMMARY OF THE DISCLOSURE

However, as in the flip chip component disclosed in Patent Document 1, when conductive bonding portions are formed by solder on the plurality of columnar electrodes having the different cross-sectional areas before the flip chip component is mounted on a mounting substrate, the amounts of solder that is formed on the front ends of the columnar electrodes depend on the cross-sectional areas of the columnar electrodes and the conductive bonding portions are therefore increased in thickness as the cross-sectional areas of the columnar electrodes are larger. With the increase in thickness, the flip chip component including the plurality of columnar electrodes having the different cross-sectional areas tilts with respect to a main surface of the mounting substrate when they are mounted on the mounting substrate. As a result, a problem that electric connection failure occurs or a problem that bonding strength is lowered arises.

An object of the present disclosure is to provide a component mounting substrate that can prevent electric connection failure and lowering of bonding strength even when a component including a plurality of columnar electrodes having different cross-sectional areas is mounted on a main surface of a mounting substrate.

A component mounting substrate according to an aspect of the present disclosure includes a component having a first columnar electrode and a second columnar electrode and a mounting substrate having a multilayer structure on which the component is mounted on a main surface. The mounting substrate includes a first connection conductor and a second connection conductor. The component includes a first conductive bonding portion which is arranged between the first columnar electrode and the first connection conductor and a second conductive bonding portion which is arranged between the second columnar electrode and the second connection conductor.

A cross-sectional area of the first columnar electrode in a direction that is parallel with the main surface is smaller than a cross-sectional area of the second columnar electrode in the direction. Accordingly, a thickness (length in a lamination direction) of the second conductive bonding portion is larger than a thickness of the first conductive bonding portion due to a difference in a growth speed of a plating film, which is caused by a difference in the cross-sectional area of the columnar electrode.

In the component mounting substrate in the aspect of the present disclosure, in a lamination direction of the mounting substrate, a position of a connection portion of the first connection conductor and the first conductive bonding portion is farther from a position of the main surface relative to a position of a connection portion of the second connection conductor and the second conductive bonding portion.

The component mounting substrate in the aspect of the present disclosure prevents the component from tilting with respect to the main surface of the mounting substrate in mounting because the difference between the thicknesses of the first and second conductive bonding portions, which is caused by the difference between the cross-sectional areas of the first and second columnar electrodes of the component, is canceled by the difference between the positions of the connection portions of the first connection conductor and the second connection conductor of the mounting substrate in the lamination direction. As a result, the component mounting substrate in the aspect of the present disclosure can prevent electric connection failure and lowering of bonding strength due to the tilt of the component with respect to the mounting substrate in mounting.

The mounting substrate is specifically configured as follows in order to cancel the difference between the thicknesses of the first and second conductive bonding portions, which is caused by the difference between the cross-sectional areas of the first and second columnar electrodes of the component.

The first connection conductor is a first interlayer connection conductor extending along the lamination direction. The second connection conductor includes a connection electrode arranged on the main surface and at least one second interlayer connection conductor connected to the connection electrode and extending along the lamination direction. The first interlayer connection conductor projects from the main surface.

That is to say, the first interlayer connection conductor and the first columnar electrode are electrically and physically connected with the first conductive bonding portion interposed therebetween. The connection electrode of the second connection conductor and the second columnar electrode are electrically and physically connected with the second conductive bonding portion interposed therebetween.

In order to form the first interlayer connection conductor projecting from the main surface, for example, the mounting substrate having the multilayer structure is formed such that the volume of the first interlayer connection conductor is larger than the volume of the second interlayer connection conductor. For example, the lengths of the first interlayer connection conductor and the second interlayer connection conductor in the lamination direction are made equal to each other and the first interlayer connection conductor is formed to be thicker than the second interlayer connection conductor. With this formation manner, the first interlayer connection conductor having a large volume swells by a larger amount than the second interlayer connection conductor and projects from the main surface when the mounting substrate is sintered.

It should be noted that the first interlayer connection conductor projecting from the main surface may be formed by making a coefficient of thermal expansion of the first interlayer connection conductor be higher than a coefficient of thermal expansion of the second interlayer connection conductor.

The connection portion of the first connection conductor and the first conductive bonding portion may be made farther from the main surface by the following configuration.

The mounting substrate has electrodes formed by application between layers. When the mounting substrate is seen along the lamination direction, the number of electrodes present in a region of the first connection conductor is larger than the number of electrodes present in a region of the second connection conductor.

That is to say, the connection portion of the first connection conductor and the first conductive bonding portion is farther from the main surface in proportion to the number of electrodes formed by the application.

Furthermore, the second connection conductor may include a plurality of the second interlayer connection conductors. With this configuration, the second columnar electrode of the component is efficiently cooled by the plurality of second interlayer connection conductors with the connection electrode interposed therebetween.

The component mounting substrate in the aspect of the present disclosure may be configured as follows instead of projection of the first connection conductor from the main surface.

In the component mounting substrate in the aspect of the present disclosure, the mounting substrate has a recess portion in a region of the second connection electrode in the main surface.

That is to say, the difference between the thicknesses of the first and second conductive bonding portions, which is caused by the difference between the cross-sectional areas of the first and second columnar electrodes, is canceled by a step of the recess portion in the main surface of the mounting substrate.

To be specific, the recess portion is formed by increasing the number of layers in the region of the first connection electrode to be larger than the number of layers in the region of the second connection electrode when seen from the lamination direction of the mounting substrate.

A component mounting substrate according to an aspect of the present disclosure can prevent electric connection failure and lowering of bonding strength even when a component including a plurality of columnar electrodes having different cross-sectional areas is mounted on a main surface of a mounting substrate.

BRIEF DESCRIPTION OF THE SEVERAL

Views of the Drawings

DETAILED DESCRIPTION OF THE DISCLOSURE

Figure 1:
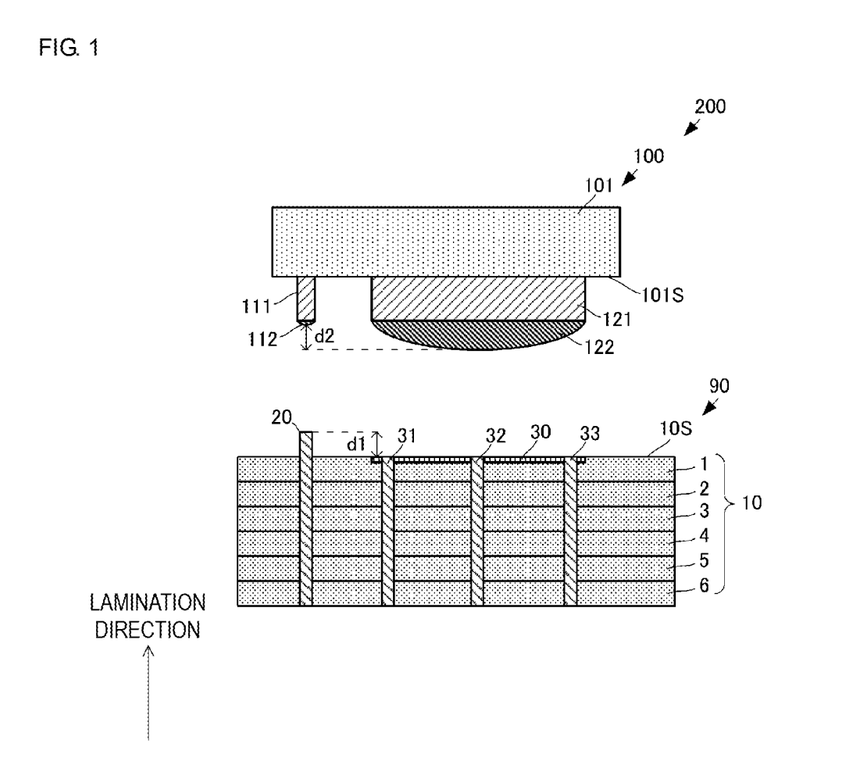
FIG. 1 is a cross-sectional side view of a component mounting substrate according to a first embodiment of the present disclosure.
Figure 2:
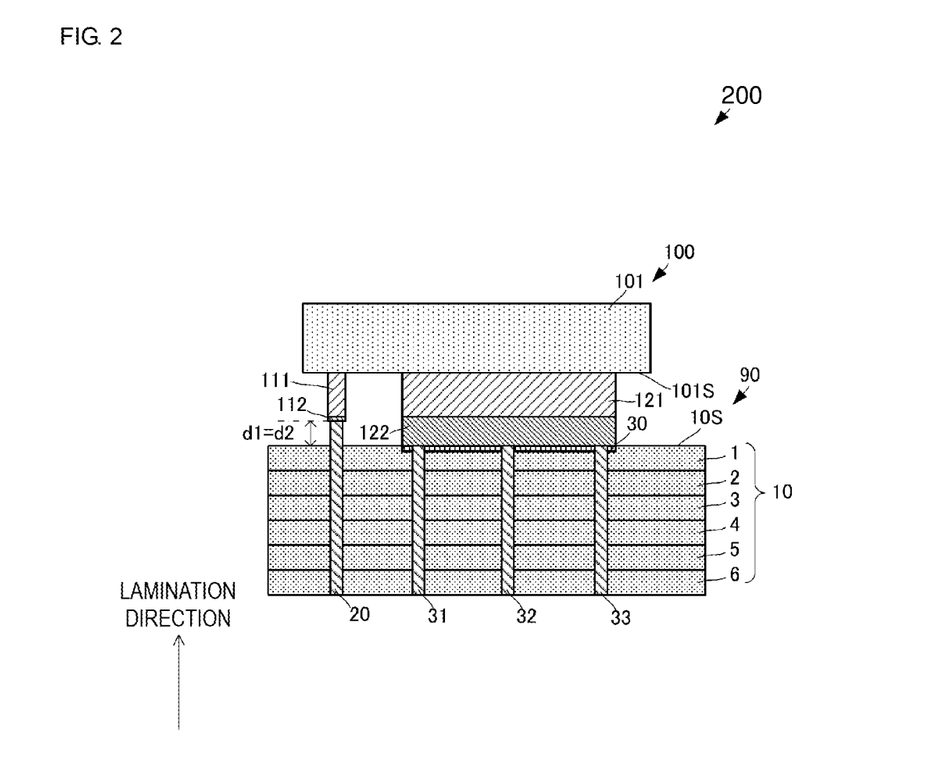
FIG. 2 is a cross-sectional side view of the component mounting substrate in the first embodiment of the present disclosure.

A component mounting substrate 200 according to a first embodiment of the present disclosure will be described with reference to the drawings. FIG. 1 and FIG. 2 are cross-sectional side views of the component mounting substrate 200. It should be noted that FIG. 1 illustrates a state before a high-frequency component 100 is mounted on a mounting substrate 90 and FIG. 2 illustrates a state after the high-frequency component 100 is mounted on the mounting substrate 90.

As illustrated in FIG. 1 and FIG. 2, the component mounting substrate 200 in the embodiment includes the mounting substrate 90 and the high-frequency component 100.

The mounting substrate 90 includes a multilayer body 10, an interlayer connection conductor 20, a connection electrode 30, and interlayer connection conductors 31, 32, and 33. As illustrated in FIG. 2, the high-frequency component 100 is mounted on an upper surface 10S of the multilayer body 10. The high-frequency component 100 is a so-called flip chip component and includes a substrate 101, a columnar electrode 111, and a columnar electrode 121. The columnar electrode 111 and the columnar electrode 121 are arranged on a lower surface 101S of the substrate 101. The high-frequency component 100 includes a power amplifier, a duplexer, and a switching circuit (they are not illustrated) on the upper surface of the substrate 101 and in the substrate 101. The power amplifier and the like are connected to an antenna (not illustrated) transmitting and receiving high-frequency signals.

The multilayer body 10 is formed by laminating a sixth layer 6, a fifth layer 5, a fourth layer 4, a third layer 3, a second layer 2, and a first layer 1 in this order along the lamination direction. The first layer 1 to the sixth layer 6 are respectively formed by insulating sheets (for example, sheets containing a glass epoxy resin).

The interlayer connection conductor 20 penetrates through the first layer 1 to the sixth layer 6 and projects from the upper surface 10S of the multilayer body 10. In order to cause the interlayer connection conductor 20 to project from the upper surface 10S of the multilayer body 10, it is sufficient that the interlayer connection conductor 20 is formed using a conductive material having a higher coefficient of thermal expansion than that of a conductive material of the interlayer connection conductors 31 to 33. With this formation manner, the interlayer connection conductor 20 swells by a larger amount than the interlayer connection conductors 31 to 33 and projects from the upper surface 10S of the multilayer body 10 when the multilayer body 10 is sintered.

The interlayer connection conductor 20 may be formed so as to project from the upper surface 10S of the multilayer body 10 by making the number of times that holes formed in the insulating sheets are filled with the conductive material for forming the interlayer connection conductor 20 projecting from the upper surface 10S greater than the number of times that holes formed in the insulating sheets are filled with the conductive material for forming the interlayer connection conductors 31 to 33. It is needless to say that the interlayer connection conductor 20 may be formed by combining the selection of the number of times of filling of the conductive material and a material which is easy to swell.

The connection electrode 30 is arranged on the upper surface 10S of the multilayer body 10. The interlayer connection conductors 31 to 33 penetrate through the first layer 1 to the sixth layer 6. The upper ends of the respective interlayer connection conductors 31 to 33 are connected to the connection electrode 30.

As illustrated in FIG. 1 and FIG. 2, the interlayer connection conductor 20 overlaps with the columnar electrode 111 of the high-frequency component 100 that is mounted when the multilayer body 10 is seen along the lamination direction. The connection electrode 30 overlaps with the columnar electrode 121 of the high-frequency component 100 that is mounted when the multilayer body 10 is seen along the lamination direction.

A conductive bonding agent (for example, solder) is used when the high-frequency component 100 is mounted on the mounting substrate 90. As illustrated in FIG. 1, a conductive bonding portion 112 capable of providing physical bonding and electrical conduction is previously formed on an end portion of the columnar electrode 111 of the high-frequency component 100 using a metal containing solder before mounting. In the same manner, a conductive bonding portion 122 is previously formed on an end portion of the columnar electrode 121 of the high-frequency component 100 before mounting.

The growth speeds of plating films depend on the cross-sectional areas of the columnar electrode 111 and the columnar electrode 121. The columnar electrode 111 and the columnar electrode 121 are preferably formed as columnar structures provided by pillar electrodes made of copper. The cross-sectional areas of the columnar electrode 111 and the columnar electrode 121 are areas when the columnar electrode 111 and the columnar electrode 121 are cut along a plane that is parallel with the lower surface 101S of the substrate 101 of the high-frequency component 100. In other words, the cross-sectional areas of the columnar electrode 111 and the columnar electrode 121 are areas when the columnar electrode 111 and the columnar electrode 121 are cut in parallel with the upper surface 10S of the multilayer body 10 in mounting of the high-frequency component 100. In the case in which the columnar electrode 111 projecting from the lower surface 101S of the substrate 101 has a constant cross-sectional area, the area of the columnar electrode 111 when the lower surface 101S of the high-frequency component 100 is seen from the direction in which the columnar electrode 111 extends is the same as the cross-sectional area of the columnar electrode 111 projecting from the high-frequency component 100.

The amount of solder is increased as the cross-sectional area is larger. Therefore, the conductive bonding portion 122 of the columnar electrode 121 having a large cross-sectional area is thicker than the conductive bonding portion 112 of the columnar electrode 111 having a small cross-sectional area. That is to say, as illustrated in FIG. 1, the length of the conductive bonding portion 122 in the lamination direction is larger than the length of the conductive bonding portion 112 by a difference d2. A distance from the lower surface 101S of the substrate 101 to the top portion of the conductive bonding portion 122 provided on the columnar electrode 121 having the large area is larger than a distance from the lower surface 101S of the substrate 101 to the top portion of the conductive bonding portion 112 provided on the columnar electrode 111 having the small area. FIG. 1 emphatically illustrates the difference d2 so as to be larger than an actual size. The lengths of the columnar electrode 111 and the columnar electrode 121 projecting from the lower surface 101S of the substrate 101 are substantially equal to each other.

In the component mounting substrate 200 in the embodiment, the projection length of the interlayer connection conductor 20 from the upper surface 10S in the lamination direction is adjusted such that a difference between a connection position of the interlayer connection conductor 20 and the conductive bonding portion 112 and a connection position of the connection electrode 30 and the conductive bonding portion 122 in the lamination direction is a difference d1.

As illustrated in FIG. 2, the difference d2 between the length of the conductive bonding portion 112 and the length of the conductive bonding portion 122 in the lamination direction is canceled by the difference d1. That is to say, in the component mounting substrate 200 in the embodiment, the difference between the thicknesses of the conductive bonding portion 112 and the conductive bonding portion 122 is canceled by the difference between the connection position of the interlayer connection conductor 20 and the conductive bonding portion 112 and the connection position of the connection electrode 30 and the conductive bonding portion 122 in the lamination direction. As a result, in the component mounting substrate 200 in the embodiment, the upper surface 10S of the multilayer body 10 and the lower surface 101S of the substrate 101 are parallel with each other when the high-frequency component 100 is mounted on the mounting substrate 90, thereby preventing the high-frequency component 100 from tilting with respect to the mounting substrate 90. The component mounting substrate 200 in the embodiment can prevent electric connection failure and lowering of bonding strength due to the tilt.

It should be noted that the difference d1 and the difference d2 may not be strictly equal to each other. Even when the difference d1 and the difference d2 are not strictly equal to each other, the degree of tilt of the high-frequency component 100 in mounting can be suppressed.

Furthermore, only one of the interlayer connection conductors 31 to 33 which are connected to the connection electrode 30 may be provided. In addition, the respective interlayer connection conductors 31 to 33 may not penetrate through from the upper surface 10S of the multilayer body 10 to the lower surface thereof and the lower ends thereof may not reach the sixth layer 6.

However, heat of the columnar electrode 121 which is connected to the connection electrode 30 can be dissipated more efficiently by increasing the number of interlayer connection conductors which are connected to the connection electrode 30 and by increasing them in length. Accordingly, in the case in which the high-frequency component 100 includes the power amplifier at a position corresponding to the columnar electrode 121 when seen along the lamination direction of the multilayer body 10, heat of the power amplifier can be dissipated efficiently by increasing the number of interlayer connection conductors which are connected to the connection electrode 30 and increasing them in length.

Figure 3:
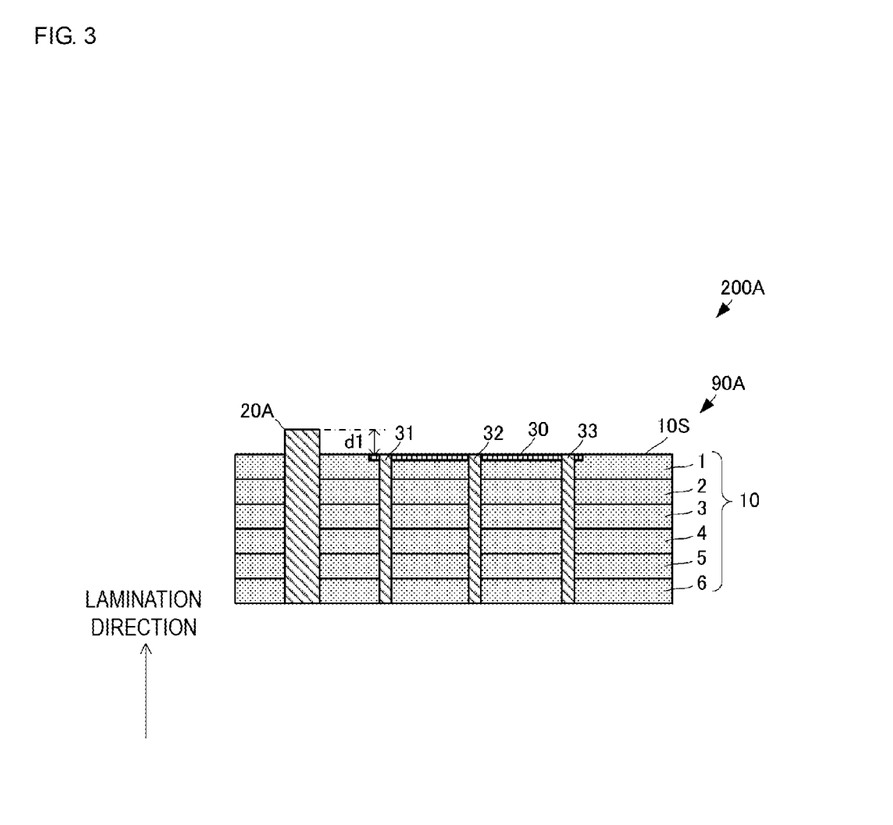
FIG. 3 is a cross-sectional side view of a component mounting substrate according to a second embodiment of the present disclosure.

Next, a component mounting substrate 200A according to a second embodiment will be described with reference to FIG. 3. FIG. 3 is a cross-sectional side view of a mounting substrate 90A of the component mounting substrate 200A. The component mounting substrate 200A in the embodiment is different from the component mounting substrate 200 in the first embodiment in the point that the cross-sectional area of an interlayer connection conductor 20A of the mounting substrate 90A is large. In other words, the interlayer connection conductor 20A is thicker than the interlayer connection conductors 31 to 33.

It is sufficient that the above-described interlayer connection conductor 20A is formed by increasing the sizes of holes which are formed in the insulating sheets and increasing the amount of conductive material which fills the holes in comparison with those for forming the interlayer connection conductors 31 to 33. With this formation manner, the interlayer connection conductor 20A swells by a larger amount than the interlayer connection conductors 31 to 33 and projects from the upper surface 10S when the multilayer body 10 is sintered.

Figure 4:
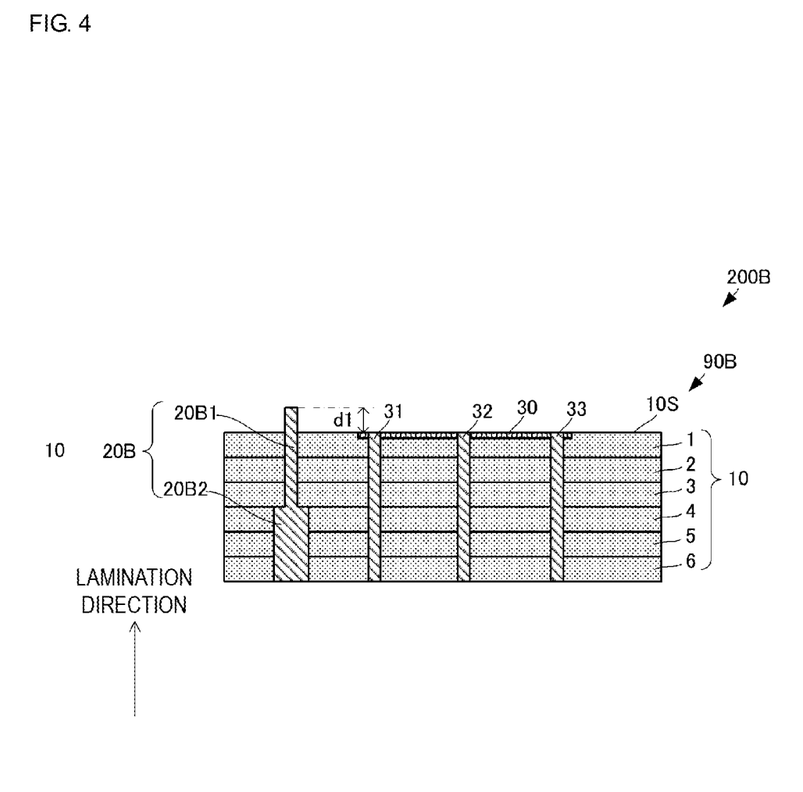
FIG. 4 is a cross-sectional side view of a component mounting substrate according to a third embodiment of the present disclosure.

Next, a component mounting substrate 200B according to a third embodiment will be described with reference to FIG. 4. FIG. 4 is a cross-sectional side view of a mounting substrate 90B of the component mounting substrate 200B. The component mounting substrate 200B of the embodiment is different from the component mounting substrate 200A of the second embodiment in that a part of an interlayer connection conductor 20B of the mounting substrate 90B is thicker than the interlayer connection conductors 31 to 33.

As illustrated in FIG. 4, the interlayer connection conductor 20B is formed by a small-diameter portion 20B1 and a large-diameter portion 20B2. The small-diameter portion 20B1 penetrates through the first layer 1 to the third layer 3 and projects from the upper surface 10S. The large-diameter portion 20B2 penetrates through the fourth layer 4 to the sixth layer 6.

As described above, the entire volume of the interlayer connection conductor 20B is large even when the interlayer connection conductor 20B is partially thicker than the interlayer connection conductors 31 to 33. Therefore, the interlayer connection conductor 20B projects from the upper surface 10S after the multilayer body 10 is sintered. FIG. 4 illustrates an example and it is sufficient that the large-diameter portion is present in any layer of the first layer 1 to the sixth layer 6.

Figure 5:
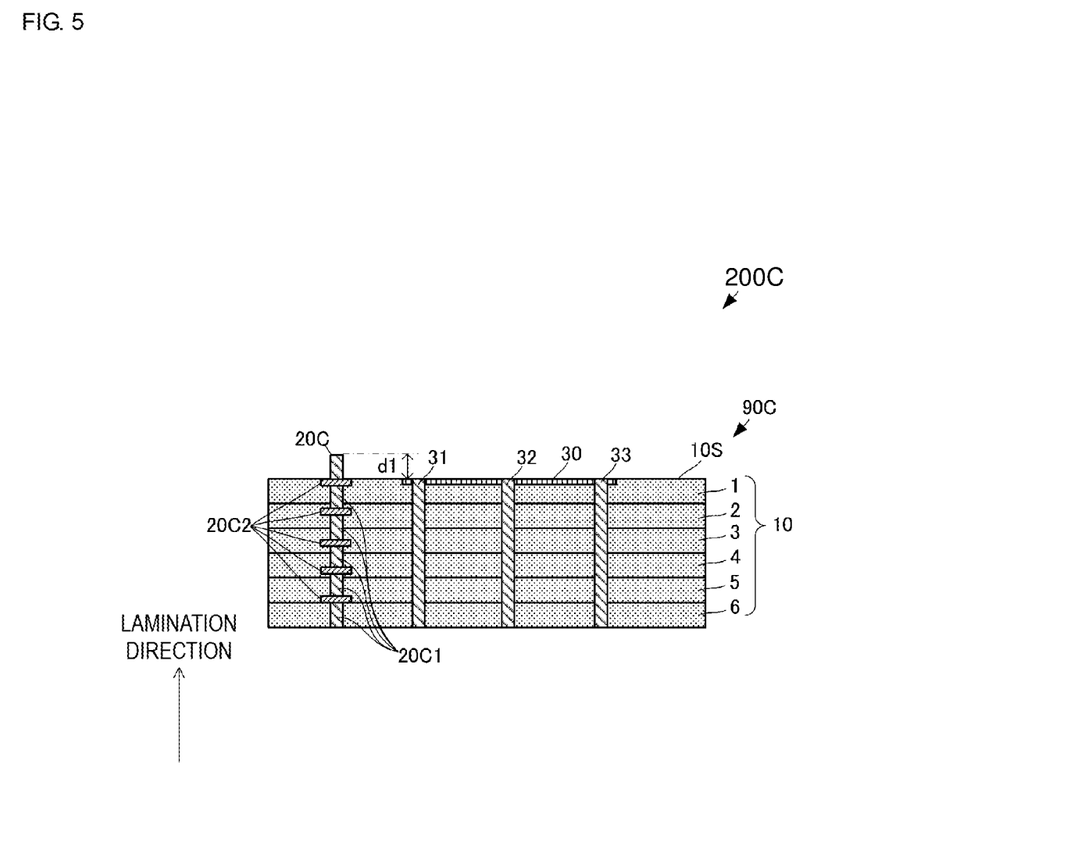
FIG. 5 is a cross-sectional side view of a component mounting substrate according to a fourth embodiment of the present disclosure.

Next, a component mounting substrate 200C according to a fourth embodiment will be described with reference to FIG. 5. FIG. 5 is a cross-sectional side view of a mounting substrate 90C of the component mounting substrate 200C. The component mounting substrate 200C of the embodiment is different from the component mounting substrate 200 of the first embodiment in that an interlayer connection conductor 20C of the mounting substrate 90C is formed by a plurality of interlayer connection conductors 20C1 and print electrodes 20C2 interposed between the interlayer connection conductors 20C1.

The print electrodes 20C2 are formed by further applying the conductive material onto the holes filled with the conductive material for the interlayer connection conductors 20C1. Although the interlayer connection conductors 31 to 33 include no print electrode in FIG. 5, they may include the print electrodes in a range of equal to or smaller than the number of print electrodes included in the interlayer connection conductor 20C.

Figure 6:
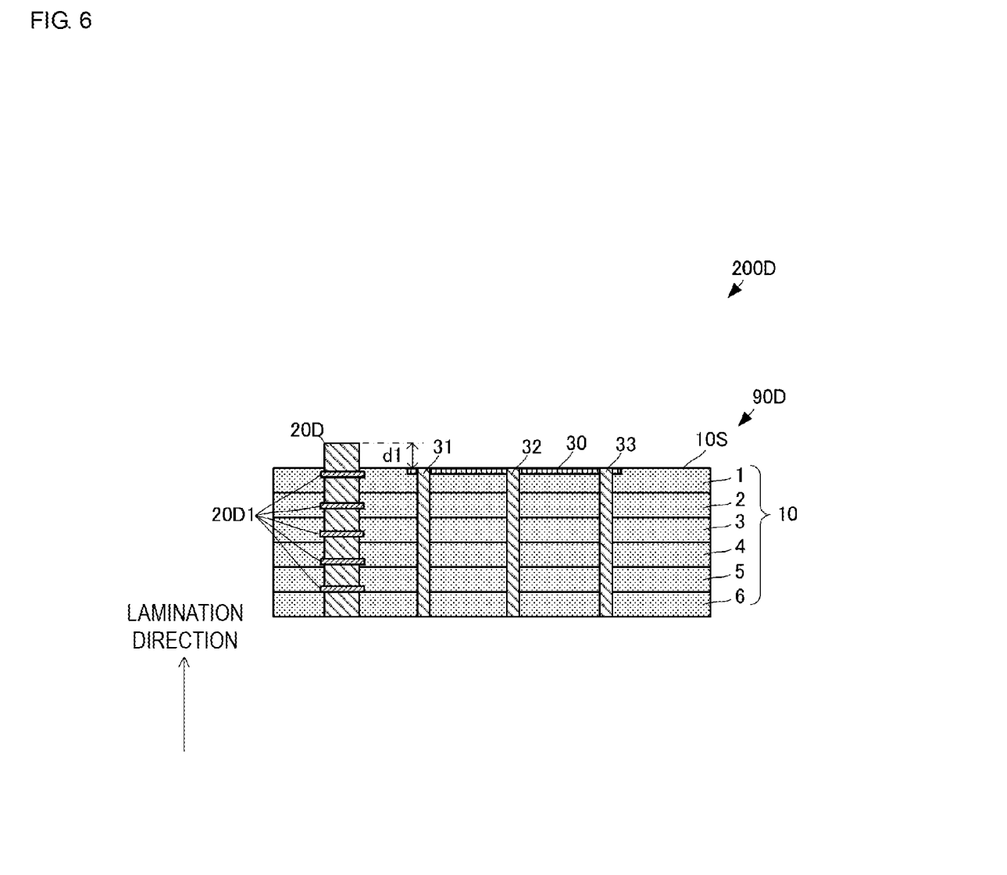
FIG. 6 is a cross-sectional side view of a component mounting substrate according to a fifth embodiment of the present disclosure.

Next, a component mounting substrate 200D according to a fifth embodiment will be described with reference to FIG. 6. FIG. 6 is a cross-sectional side view of a mounting substrate 90D of the component mounting substrate 200D. The component mounting substrate 200D of the embodiment is provided by combining the characteristics of the component mounting substrate 200A of the second embodiment and the characteristics of the component mounting substrate 200C of the fourth embodiment.

To be specific, the diameter of an interlayer connection conductor 20D is thicker than those of the interlayer connection conductors 31 to 33, and the interlayer connection conductor 20D includes a plurality of print electrodes 20D1. When the mounting substrate 90D is a sintered-type multilayer substrate containing ceramics such as LTCC and HTCC, the interlayer connection conductor 20D is preferable for the following reason. That is, a contraction rate of the mounting substrate in the vicinity of the interlayer connection conductor 20D in the lamination direction when it is sintered can be lowered and the height of the interlayer connection conductor 20D from the first layer 1 of the mounting substrate 90D in the lamination direction on the surface of the mounting substrate can be made larger than the heights of the interlayer connection conductors 31 to 33 therefrom by making the diameter of the interlayer connection conductor 20D which is connected to the columnar electrode 111 having the relatively small area larger than the diameters of the interlayer connection conductors 31 to 33. Furthermore, the distance of the interlayer connection conductor 20D projecting from the upper surface 10S of the mounting substrate 90D can be easily increased, thereby relatively decreasing the stress incurred on the mounting substrate 90D with the pressure in mounting. Therefore, the interlayer connection conductor 20D is preferable. Moreover, in the case in which the plurality of print electrodes 20D1 disposed between the ceramic layers and the interlayer connection conductor 20D are arranged so as to overlap with each other when the mounting substrate 90D is seen from the lamination direction, a difference between the height of the interlayer connection conductor 20D from the first layer 1 of the mounting substrate 90D in the lamination direction on the surface of the multilayer substrate and the heights of the interlayer connection conductors 31 to 33 therefrom can be increased. Therefore, this configuration is more preferable.

It is needless to say that an interlayer connection conductor which includes print electrodes and only a part of which is thick may be formed by combining the characteristics of the component mounting substrate 200B in the third embodiment and the characteristics of the component mounting substrate 200C in the fourth embodiment.

Figure 7:
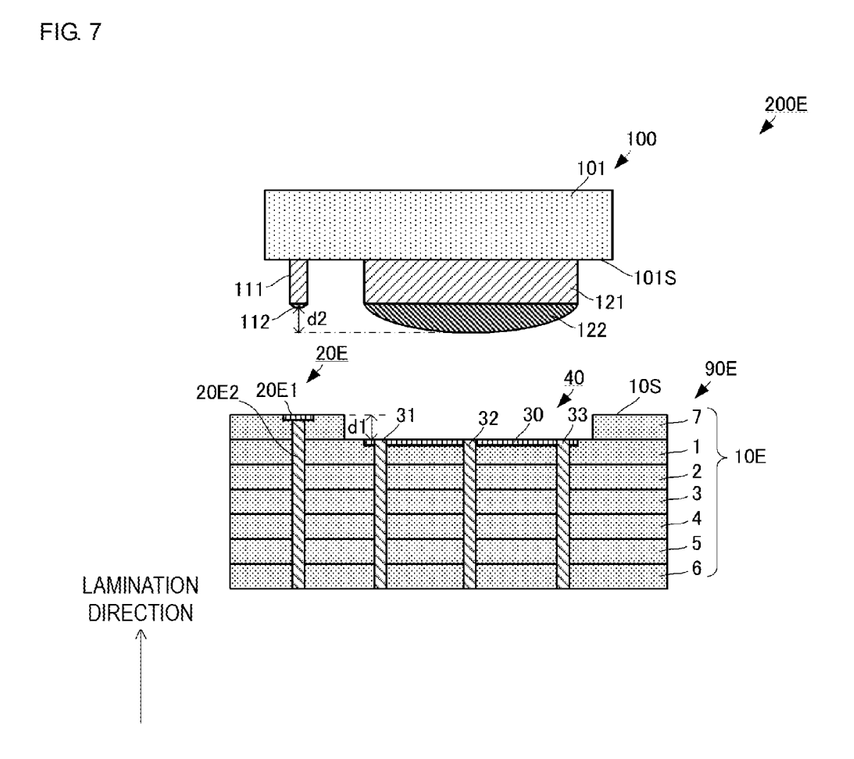
FIG. 7 is a cross-sectional side view of a component mounting substrate according to a sixth embodiment of the present disclosure.

Next, a component mounting substrate 200E according to a sixth embodiment will be described with reference to FIG. 7. FIG. 7 is a cross-sectional side view of the component mounting substrate 200E. The component mounting substrate 200E of the embodiment is different from the component mounting substrate 200 of the first embodiment in that a connection electrode 20E1 of a mounting substrate 90E is physically and electrically connected to the conductive bonding portion 112 and a multilayer body 10E has a recess portion 40 in the upper surface 10S.

As illustrated in FIG. 7, the recess portion 40 is formed by forming a part of the multilayer body 10E by seven layers including a seventh layer 7 and forming other parts by six layers. To be specific, the recess portion 40 is formed so as to contain the columnar electrode 121 when the multilayer body 10E is seen along the lamination direction. A region of the upper surface 10S other than the recess portion 40 is formed by laminating the seventh layer 7 on the first layer 1.

A connection conductor 20E is formed by a connection electrode 20E1 and an interlayer connection conductor 20E2. The connection electrode 20E1 is arranged in a region of the upper surface 10S in which the seventh layer 7 is laminated. The thickness of the seventh layer 7 is set such that a difference d1 between a position of the connection electrode 20E1 and a position of the connection electrode 30 in the lamination direction is equal to the difference d2 in the high-frequency component 100.

- 10, 10E MULTILAYER BODY
- 20, 20A, 20B, 20C, 20D INTERLAYER CONNECTION CONDUCTOR
- 20B1 SMALL-DIAMETER PORTION
- 20B2 LARGE-DIAMETER PORTION
- 20C1 INTERLAYER CONNECTION CONDUCTOR
- 20C2, 20D1 PRINT ELECTRODE
- 20E CONNECTION CONDUCTOR
- 20E1 CONNECTION ELECTRODE
- 20E2 INTERLAYER CONNECTION CONDUCTOR
- 30 CONNECTION ELECTRODE
- 31, 32, 33 INTERLAYER CONNECTION CONDUCTOR
- 40 RECESS PORTION
- 200, 200A, 200B, 200C, 200D, 200E COMPONENT MOUNTING
- 101 SUBSTRATE
- 90, 90A, 90B, 90C, 90D, 90E MOUNTING SUBSTRATE
- 100 HIGH-FREQUENCY COMPONENT
- 101 SUBSTRATE
- 111, 121 COLUMNAR ELECTRODE
- 112, 122 CONDUCTIVE BONDING PORTION

The invention claimed is:

1. A component mounting substrate comprising:
    a component having a first columnar electrode and a second columnar electrode; and
    a mounting substrate having a multilayer structure, wherein the component is mounted on a main surface of the mounting substrate,
    wherein the mounting substrate includes a first connection conductor and a second connection conductor,
    the component includes a first conductive bonding portion arranged between the first columnar electrode and the first connection conductor and a second conductive bonding portion arranged between the second columnar electrode and the second connection conductor,
    a cross-sectional area of the first columnar electrode in a direction parallel with the main surface is smaller than a cross-sectional area of the second columnar electrode in the direction, and
    in a lamination direction of the mounting substrate, a position of a connection portion of the first connection conductor and the first conductive bonding portion is farther from a position of the main surface than a position of a connection portion of the second connection conductor and the second conductive bonding portion.

2. The component mounting substrate according to claim 1,
    wherein the first connection conductor is a first interlayer connection conductor extending along the lamination direction,
    the second connection conductor includes a connection electrode arranged on the main surface and at least one second interlayer connection conductor connected to the connection electrode and extending along the lamination direction, and
    the first interlayer connection conductor projects from the main surface.

3. The component mounting substrate according to claim 2,
    wherein a volume of the first interlayer connection conductor is larger than a volume of the second interlayer connection conductor.

4. The component mounting substrate according to claim 2,
    wherein a coefficient of thermal expansion of the first interlayer connection conductor is higher than a coefficient of thermal expansion of the second interlayer connection conductor.

5. The component mounting substrate according to claim 2,
    wherein the at least one second connection conductor includes a plurality of second interlayer connection conductors.

6. The component mounting substrate according to claim 1,
    wherein the mounting substrate has electrodes applied between layers, and
    when the mounting substrate is seen along the lamination direction, a number of electrodes present in a region of the first connection conductor is larger than a number of electrodes present in a region of the second connection conductor.

7. A component mounting substrate comprising:
    a component having a first columnar electrode and a second columnar electrode; and
    a mounting substrate having a multilayer structure, wherein the component is mounted on a main surface of the mounting substrate,
    wherein the mounting substrate includes a first connection electrode arranged on the main surface and a second connection electrode arranged on the main surface,
    the component includes a first conductive bonding portion arranged between the first columnar electrode and a first connection conductor and a second conductive bonding portion arranged between the second columnar electrode and a second connection conductor,
    a cross-sectional area of the first columnar electrode in a direction parallel with the main surface is smaller than a cross-sectional area of the second columnar electrode in the direction, and
    the mounting substrate has a recess portion in a region of the second connection electrode in the main surface.

8. The component mounting substrate according to claim 7,
    wherein in the recess portion, a number of layers of the mounting substrate in a region of the first connection electrode is larger than a number of layers of the mounting substrate in a region of the second connection electrode, when seen from a lamination direction of the mounting substrate.

9. The component mounting substrate according to claim 3, wherein a coefficient of thermal expansion of the first interlayer connection conductor is higher than a coefficient of thermal expansion of the second interlayer connection conductor.

10. The component mounting substrate according to claim 3,
wherein the at least one second connection conductor includes a plurality of second interlayer connection conductors.

11. The component mounting substrate according to claim 4,
wherein the at least one second connection conductor includes a plurality of second interlayer connection conductors.

12. The component mounting substrate according to claim 2,
wherein the mounting substrate has electrodes applied between layers, and
when the mounting substrate is seen along the lamination direction, a number of electrodes present in a region of the first connection conductor is larger than a number of electrodes present in a region of the second connection conductor.

13. The component mounting substrate according to claim 3,
wherein the mounting substrate has electrodes applied between layers, and
when the mounting substrate is seen along the lamination direction, a number of electrodes present in a region of the first connection conductor is larger than a number of electrodes present in a region of the second connection conductor.

14. The component mounting substrate according to claim 4,
wherein the mounting substrate has electrodes applied between layers, and
when the mounting substrate is seen along the lamination direction, a number of electrodes present in a region of the first connection conductor is larger than a number of electrodes present in a region of the second connection conductor.

15. The component mounting substrate according to claim 5,
wherein the mounting substrate has electrodes applied between layers, and
when the mounting substrate is seen along the lamination direction, a number of electrodes present in a region of the first connection conductor is larger than a number of electrodes present in a region of the second connection conductor.

* * * * *

UNITED STATES PATENT AND TRADEMARK OFFICE
CERTIFICATE OF CORRECTION

PATENT NO. : 10,111,331 B2
APPLICATION NO. : 15/829881
DATED : October 23, 2018
INVENTOR(S) : Takanori Uejima Page 1 of 1

It is certified that error appears in the above-identified patent and that said Letters Patent is hereby corrected as shown below:

In the Specification

Column 4, Line 43, "1015" should be -- 101S --.

Column 5, Line 50, "1015" should be -- 101S --.

Column 5, Line 58, "1015" should be -- 101S --.

Column 5, Line 60, "1015" should be -- 101S --.

Column 6, Line 7, "1015" should be -- 101S --.

Column 6, Line 10, "1015" should be -- 101S --.

Column 6, Line 16, "1015" should be -- 101S --.

Column 6, Line 41, "1015" should be -- 101S --.

Signed and Sealed this
Twenty-ninth Day of January, 2019

Andrei Iancu
*Director of the United States Patent and Trademark Office*